United States Patent
Pelletier et al.

(10) Patent No.: US 9,812,298 B2
(45) Date of Patent: Nov. 7, 2017

(54) CLEANING DEVICE AND CLEANING PROCESS FOR A PLASMA REACTOR

(71) Applicants: CENTRE NATIONAL DE LA RECHERCHE SCIENTIFIQUE (CNRS), Paris (FR); Universite Joseph Fourier—Grenoble 1, St. Martin d'Heres (FR)

(72) Inventors: Jacques Henri Pelletier, Saint Martin d'Heres (FR); Ana Lacoste, Saint Martin le Vinoux (FR); Alexandre Bes, Vourey (FR); Stephane Jean Louis Bechu, Chantesse (FR); Jerome Sirou, Grenoble (FR)

(73) Assignees: CENTRE NATIONAL DE LA RECHERCHE SCIENTIFIQUE (CNRS), Paris (FR); UNIVERSITE JOSEPH FOURIER—GRENOBLE 1, St. Martin d'Heres (FR)

( * ) Notice: Subject to any disclaimer, the term of this patent is extended or adjusted under 35 U.S.C. 154(b) by 347 days.

(21) Appl. No.: 14/313,200

(22) Filed: Jun. 24, 2014

(65) Prior Publication Data
US 2014/0305467 A1    Oct. 16, 2014

Related U.S. Application Data

(62) Division of application No. 12/308,296, filed as application No. PCT/EP2007/055830 on Jun. 13, 2007, now abandoned.

(51) Int. Cl.
| | |
|---|---|
| H01J 37/32 | (2006.01) |
| H01L 21/67 | (2006.01) |
| C23C 16/44 | (2006.01) |

(52) U.S. Cl.
CPC .... *H01J 37/32862* (2013.01); *C23C 16/4405* (2013.01); *H01J 37/32871* (2013.01); *H01L 21/67069* (2013.01)

(58) Field of Classification Search
CPC .......... H01J 37/32862; H01J 37/32871; H01L 21/67069; C23C 16/4405
USPC .................................................. 134/1.1, 1.2
See application file for complete search history.

(56) References Cited

U.S. PATENT DOCUMENTS

| | | | |
|---|---|---|---|
| 5,102,687 A | | 4/1992 | Pelletier et al. |
| 5,507,874 A | * | 4/1996 | Su .................... B08B 7/0035 |
| | | | 118/723 R |
| 5,605,637 A | | 2/1997 | Shan et al. |
| 5,688,330 A | | 11/1997 | Ohmi |

(Continued)

FOREIGN PATENT DOCUMENTS

| | | |
|---|---|---|
| JP | 63119225 | 5/1988 |
| JP | 63-224232 | 9/1988 |

(Continued)

*Primary Examiner* — Saeed T Chaudhry
(74) *Attorney, Agent, or Firm* — Blakely Sokoloff Taylor & Zafman LLP (57) ABSTRACT

The invention concerns a device and a process, the device being a cleaning device utilizing a dry chemical means assisted by plasma from a reactor (10) containing an unwanted deposit on its walls and at least one other polarizable surface (12), characterized in that it comprises means (13, 14) for positively polarizing one or each of the polarizable surfaces relative to the reactor walls maintained at a reference potential.

6 Claims, 2 Drawing Sheets

(56) References Cited

U.S. PATENT DOCUMENTS

| | | | |
|---|---|---|---|
| 6,010,967 | A | 1/2000 | Donohoe et al. |
| 6,071,372 | A | 6/2000 | Ye et al. |
| 6,149,783 | A | 11/2000 | Signer et al. |
| 6,165,377 | A | 12/2000 | Kawahara et al. |
| 7,615,132 | B2 | 11/2009 | Yasui et al. |
| 2001/0037857 | A1 | 11/2001 | Kazumi et al. |
| 2004/0075060 | A1 | 4/2004 | Luten et al. |

FOREIGN PATENT DOCUMENTS

| | | |
|---|---|---|
| JP | 03150379 | 6/1991 |
| JP | 3-260051 | 11/1991 |
| JP | 2006-185992 | 7/2006 |

\* cited by examiner

CLEANING DEVICE AND CLEANING PROCESS FOR A PLASMA REACTOR

FIELD OF THE INVENTION

The invention concerns a device for cleaning a reactor.

The invention concerns more precisely a device for plasma-assisted dry chemical cleaning of a reactor having an undesirable deposit.

The invention concerns the method of cleaning a reactor implemented with the device according to the invention.

In general terms, the invention applies to reactors using dry methods and the walls of which are covered with undesirable deposits.

The invention applies to the cleaning of deposition and surface treatment reactors.

This is the case, for example, with PACVD (plasma-assisted chemical vapour deposition) and PAPVD (plasma-assisted physical vapour deposition) reactors or etching reactors, in methods acting on the etching-deposition balance selective $SiO_2$ etching with respect to silicon, anisotropic etching by lateral passivation).

The invention can also apply to CVD (silicon, tungsten), laser deposition or MBE (molecular beam epitaxy) reactors, the walls of which it is necessary to clean periodically to prevent redeposition or dust on the surfaces.

PRIOR ART

The problem of the cleaning of reactors in general, and deposition reactors in particular, assumes crucial importance in electronics, optics and micro-nanotechnology, but also in surface treatments (metal spraying, or deposition of hard, tribological or anticorrosion layers) in very many industrial sectors. The cleaning time and therefore the time for immobilisation of the production reactors represents a significant cost. Despite this cost, the cleaning of the reactors is a necessity for preserving quality and reproducibility for the processes implemented.

For this reason, in microelectronics, the trend is for periodic cleaning (every "n" deposition, or even after each deposition), usually by chemical cleaning by liquid or dry method (e.g. plasma). This is the case for example with the cleaning of reactors depositing Si, $SiO_2$ or $Si_3N_4$ in reactors of the capacitive RF type (radio frequency discharge between two parallel electrodes). In this case, the equipment manufacturers have different strategies such as:

i) cleaning of the reactors in a liquid bath (wet, chemical method), but the time taken for dismantling and treating the reactor is prohibitive and requires two sets of treatment parts;

ii) plasma etching using gentle processes, that is to say by purely reactive dry chemical method.

For this reason, the majority of equipment manufacturers have developed reactor cleaning methods using auxiliary gas plasmas that are as reactive as possible vis-à-vis the deposits to be removed by reactive chemical method, and at relatively high pressure in order to produce the greatest possible concentrations of reactive species (for example atomic fluorine F for chemical etching of Si, $SiO_2$, $Si_3N_4$ or W, atomic oxygen O for the etching of carbon or polymers) and heating the walls in order to thermally activate the chemical etching reactions.

Thus it is possible to clean $SiO_2$ or $Si_3N_4$ on walls of reactors covered with these deposits by raising them to 300° to 400° C. in the presence of an $NF_3$ plasma generated by inductive RF coupling or by surface wave). However, in general, this type of cleaning is possible only if stable volatile reaction products can be formed from the various elements of the deposit to be removed.

The dry cleaning techniques proposed above often have either often high cleaning times by purely chemical method, or high chemical aggressiveness on certain components of the reactor at high temperature (fluorine with nickel, oxygen with the dielectric insulators, and hence high cleaning cost.

They usually require the use of an auxiliary plasma source operating at a higher pressure than the plasma used for the process, and the choice of exotic gases or gases difficult to use, which also poses the problem of the cost of the gases (high flow rates), the retreatment of high gas volumes discharged from the reactor, and safety through the manipulation of dangerous gases (toxic, corrosive, flammable or explosive). An example of this is given in the document US 2005/0224458.

The investment and operating costs incurred by current techniques are therefore extremely high.

One objective of the invention is therefore to propose a cleaning device requiring only minor modifications to the reactor.

An objective of the invention is to propose a simplified cleaning method relying on plasma-assisted dry chemical etching methods, in particular using ion bombardment.

It is this ion bombardment that it is proposed to control in the invention.

SUMMARY OF THE INVENTION

To achieve these objectives, there is provided in the context of the present invention a method for the plasma-assisted dry chemical cleaning of a reactor having an undesirable deposit on its walls and on at least one other biasable surface, characterised in that at least one sequence, referred to as a positive sequence, of cleaning the walls of the reactor was implemented by positive biasing of the or each biasable surface, with respect to the walls of the reactor, the walls being at a referenced potential.

The method according to the invention can also have at least one of the following characteristics:
  at least one other sequence is implemented, referred to as a negative sequence, for cleaning the or each biasable surface by negative biasing thereof, with respect to the walls of the reactor;
  a negative sequence followed by a positive sequence is implemented;
  at least one alternating succession of a positive sequence and a negative sequence is implemented;
  a plurality of periodic alternating successions of a positive sequence and a negative sequence are implemented;
  a biasing to referenced voltage of the or each biasable surface is implemented during the positive sequence;
  a biasing to referenced voltage of the or each biasable surface is implemented during the negative sequence;
  an auto-biasing of the or each biasable surface is implemented during the negative sequence.

To achieve these objectives, there is also provided in the context of the present invention a device for the plasma-assisted dry chemical cleaning of a reactor having an undesirable deposit on its walls and on at least one other biasable surface, characterised in that it comprises means for positively biasing, with respect to the walls of the reactor maintained at a referenced potential, the or each biasable surface.

The device according to the invention can also have at least one of the following characteristics:

it comprises means for negatively biasing, with respect to the walls of the reactor, the or each biasable surface;

it comprises means for successively alternating the sign of the biasing, with respect to the walls of the reactor, of the or each biasable surface;

it comprises a DC voltage generator, electrically connected to the or each biasable surface, and means of controlling the generator for successively delivering positive and negative voltages, with reference to the walls of the reactor;

it comprises means for successively and periodically alternating the sign of the biasing, with respect to the walls of the reactor, of the or each biasable surface;

it comprises a periodic voltage generator, connected electrically to the or each biasable surface by means of a circuit comprising a low-impedance capacitor and means for short-circuiting the capacitor;

it comprises a periodic voltage generator, in direct electrical connection with the or each biasable surface and referenced with respect to the walls of the which are preferably earthed.

BRIEF DESCRIPTION OF THE DRAWINGS

Other characteristics, aims, advantages and objectives of the present invention will emerge from a reading of the following detailed description, and with regard to the accompanying drawings, given by way of non-limitative examples and on which.

DETAILED DESCRIPTION OF THE INVENTION

The method according to the invention is a plasma-assisted chemical etching cleaning method.

This can use plasma etching methods conventional in microelectronics and microtechnologies, such as for example:

i) etching of carbon C or carbon compounds (DLC, polymers, etc) by plasmas containing oxygen, ii) etching of silicon Si or tungsten W by plasmas based on fluorine ($SF_6$, $CF_4$, $NF_3$, etc), iii) etching of $SiO_2$ or $Si_3N_4$ by plasmas based on fluorine ($SF_6$, $CF_4$, $NF_3$, etc), iv) etching of Al, B or other compounds by plasmas based on bromine or chorine ($Br_2$, $Cl_2$, HBr, etc).

So that the cleaning method according to the invention can be implemented, it is necessary for the plasma to be produced in a reactor with walls at referenced potentials (for example earthed).

The cleaning operation comprises at least one cleaning sequence (by plasma etching) in which the walls of the reactor are cleaned by positive biasing, with respect to the walls of the reactor, of the or each biasable surface (for example substrate carrier or electrode). This sequence or sequences are called sequence 2 or positive sequence in the remainder of the description.

The operation comprises, according to the application, at least one other sequence of cleaning the or each biasable surface (for example substrate carrier and/or electrode) by negative biasing of the biasable surface with respect to the walls of the reactor. This sequence or sequences are called sequence 1 or negative sequence in the remainder of the description.

Cleaning of a Conductive Deposit

If the deposit to be cleaned is conductive (C, W, Si etc) and the biasable surface does not need to be cleaned (because its disposition within the reactor for example, or because it carries a substrate during the deposition operations, or because the deposit is considered to be negligible), a sequence 2 may suffice: there is then complete cleaning of the walls of the reactor (chamber) by application to the biasable surface (substrate carrier or electrode) of a positive DC voltage with respect to the walls.

If the deposit to be cleaned is conductive (C, W, Si etc) and the biasable surface is also to be cleaned, two successive sequences only may suffice, namely a sequence 1 and a sequence 2: there is then complete cleaning of the biasable surface by application to this surface (substrate carrier or electrode) of a negative DC voltage with respect to the walls (for example earthed) and the complete cleaning of the walls of the chamber by application to the surface (substrate carrier or electrode) of a positive DC voltage with respect to the walls.

Figure 1:
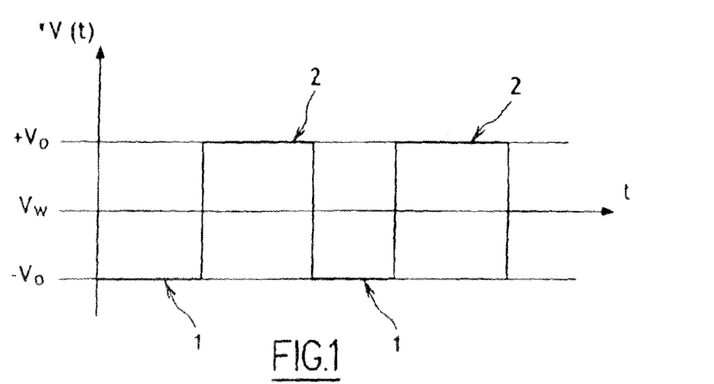
FIG. 1 depicts by or example DC voltages applied to at least one biasable surface of a reactor, according to the two types of sequence, with respect to the referenced wall potential $V_w$.

Reference can be made to FIG. 1, where the voltage V(t) supplied to the biasable surface and to which it is raised changes from a sequence 1, referenced 1, to a sequence 2, referenced 2, and where $V_w$ is the potential of the walls of the reactor.

Note that, in the context of the invention, it is of little importance whether sequence 1 is carried out followed by sequence 2 or vice versa. However, in practice, it is more suitable to commence with sequence 1, that is to say to carry out the cleaning of the biasable surface.

The biasable surface (substrate carrier or electrode) can be small compared with the surface of the calls to be cleaned but must have a sufficiently large size to disturb the plasma, so that the potential of the plasma $V_p$ is positioned, at each moment t, at a value that is always more positive than the most positive surface (wall or electrode).

The condition to be fulfilled for constituting a substrate carrier or a large-size electrode is that the ratio of the surface $S_s$ of the substrate carrier or large-size electrode to the surface $S_w$ of the walls is at least greater than approximately 1.5 times the square root of the ratio of the mass $m_e$ of the electrons to that of the ions $m_i$, that is to say:

$$S_s/S_w > 1.5(m_e/m_i)^{1/2} \tag{1}$$

For argon, it is therefore necessary for the ratio to be greater than 1/180 (1/30 for hydrogen and 1/500 for xenon), which is generally the case with substrate carriers or electrodes used in microelectronics or in surface treatments by furnace.

Below the ratio given by equation (1), the surface $S_s$ does not disturb the plasma, which corresponds to the case of electrostatic probes or Langmuir probes. In this case, the plasma potential $V_p$ remains practically unchanged compared with the potential of the walls (generally earthed) if the biasable surface of the surface $S_s$ is positively biased with respect to the potential $V_w$ of the walls. The ion bombardment energy $W_w$ of the walls of the reactor is then close to:

$$W_w \approx e(V_p - V_f) = (kT_e/2)[1 + \ln(m_i/2\pi m_e)] \quad (2)$$

where k is Boltzmann's constant, e the charge on the electron, $T_e$ is the electron temperature and $V_f$ the potential of the biasable surface which is floating, then equal as a first approximation to the potential of the walls ($V_f \approx V_w$).

On the other hand, in the general case that interests us here, that of a ratio $S_s/S_w$ higher than the value given by equation (1), the biasable surface $S_s$ profoundly disturbs the equilibrium of the plasma if it is raised to a positive potential $V_0$ with respect to the potential of the walls $V_w$ (sequence 2). In this case, the plasma potential $V_p$ is offset by the value $V_0 - V_w$ and the ion bombardment energy $V_w$ of the walls is, as a first approximation, for a DC voltage $V_0$, equal to:

$$W_w \approx e(V_p - V_w) = e(V_p - V_f + V_0 - V_w) \quad (3)$$

In other words, by positively biasing the biasable surface $S_s$ so the DC potential $V_0$ with respect to the potential of the walls $V_w$ (sequence 2), it is possible to adjust to the required value the ion bombardment energy on the walls during sequence 2. During this sequence, the ion bombardment energy $W_s$ of the electrode is equal to:

$$W_s \approx e(V_p - V_f) \quad (4)$$

If now the surface $S_s$ is negatively biased to the DC potential $-V_0$ with respect to the potential of the walls $V_w$ (sequence 1), the ion bombardment energy $W_s$ of the surface $S_s$ is equal to:

$$W_s = e(V_p - V_s) = e(V_p - V_f + V_w - V_0) \quad (5)$$

while the ion bombardment energy $W_w$ of the walls during this same sequence is equal to:

$$W_w = e(V_p - V_f) \quad (6)$$

It can be seen therefore that the bombardment energies of the walls and large-size electrode are reversed when changing from sequence 1 to sequence 2.

In the case of the cleaning of a conductive deposit, on the walls of the reactor and on at least one other biasable surface of the reactor, it is therefore possible to clean the reactor in two stages:
  cleaning of the large-sized biasable surface (substrate carrier or electrode) during sequence 1 by adjusting the energy of the ion bombardment $W_s$ by means of the value $-V_0$ of the DC voltage applied to the large-sized biasable surface (FIG. 1), and
  cleaning of the walls of the reactor during sequence 2 by adjusting the energy of the ion bombardment $W_w$ by means of the value $+V_0$ at the DC voltage applied to the large-sized electrode (FIG. 1).

This is because, since the rate of chemical etching caused by the ion bombardment increases rapidly with the energy, a method of rapid cleaning of the reactor requires a more energetic con bombardment than that due solely to the difference between plasma potential and floating potential of the biasable surface.

In equations (3) and (5) and in FIG. 1, $+V_0$ and $-V_0$ are opposite values, but nothing makes it necessary to take symmetrical biasing values $V_0$. However, as it is preferable to remain below or close to the values of the sputtering thresholds of the reactor, it is more convenient to choose symmetrical values as in the previous example, with typically $V_0$=30 to 100 V.

As mentioned above, a sequence 2 or a succession of a sequence 1 and a sequence 2 may suffice according to circumstances. However, if the cleaning of the walls contaminates the large-sized biasable surface, or vice versa, it is preferable to provide is certain number of alternating sequences until there is complete cleaning of the reactor (walls and large-sized biasable surface).

It should be noted that, in the case where the substrate carrier is used as a large-sized electrode, some parts concealed by the substrate may prove to be free of deposit. In fact the deposit may affect solely the edges of the substrate carrier but in this case it is preferable to clean the whole of the substrate carrier (sequence 1).

Cleaning of an Electrically Insulating Deposit

If the deposit to be cleaned is insulating ($SiO_2$, $Si_3H_4$, etc) and the biasable surface does not need to be cleaned (no insulating deposit), a sequence 2 may suffice.

In the general case, it is however essential to apply a succession of periodic alternating sequences comprising the two sequences described previously:
  partial cleaning of the biasable surface (substrate carrier or electrode) during the negative half wave with respect to the walls (generally earthed) of a periodic voltage applied to the biasable surface, and
  partial cleaning of the walls during the positive half wave (with respect to the walls) of a periodic voltage applied to the biasable surface.

These sequences are applied until there is complete cleaning of the reactor.

Here also, it should be noted that, in the context of the invention, it is of little importance whether sequence 1 is carried out followed by sequence 2 or vice versa. However, in practice, it is more suitable to commence with sequence 1, that is to say to carry out the cleaning of the biasable surface.

Here also, the ratio of the surface areas of the biasable surface and the walls of the reactor must comply with equation (1).

The periodic voltage of frequency $f_0$, supplied for example by a periodic voltage generator, is referenced with respect to the potential of the walls of the reactor (generally earthed), which is not in principle the case with the biasable surface (auto-biasing mode is thought of).

This is because, in the case of the cleaning of an insulating deposit, it is no longer possible to clean the reactor with alternating DC biasing voltages (FIG. 1), and it is therefore necessary to have recourse to periodic biasing to a higher frequency by capacitive effect.

Thus, during a first sequence (sequence 1 or negative sequence) of the periodic biasing, it is usual to carry out negative auto-biasing of the biasable surface (substrate carrier or large-sized electrode) by applying a periodic voltage to the biasable surface through a low-impedance capacitor (the current case of RF auto-biasing) and therefore to clean the large-sized biasable surface by chemical etching assisted by ion bombardment (plasma).

Figure 2:
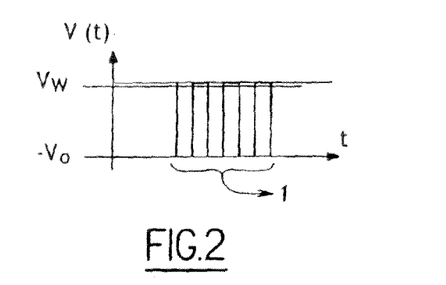
FIG. 2 depicts, by way of example, a periodic voltage signal V(t) supplied to at least one biasable surface, during a sequence referred to as sequence 1 or negative sequence, in which the biasable surface auto-biases negatively with respect to the referenced potential of the walls $V_w$.

During this sequence 1, an adapted means therefore supplies a periodic voltage signal V(t) (such as the one illustrated in FIG. 2) to the biasable surface which, for its part, biases itself (auto-biasing) so that it receives, during a period, as many positive charges (ions) as negative charges (electrons) having regard to the voltage values taken by this signal and that of the plasma potential.

This auto-biasing results from the non-linearity of the current/voltage characteristic of the plasma.

Once the biasable surface (substrate carrier or electrode) is clean, the invention consists of applying to it, during a second sequence (sequence 2 or positive sequence), a periodic voltage referenced (for example to the potential of the walls, generally earthed) so that the voltage applied to the biasable surface during the positive half wave takes a positive value $+V_0$ with respect to the potential of the walls.

Figure 3A:
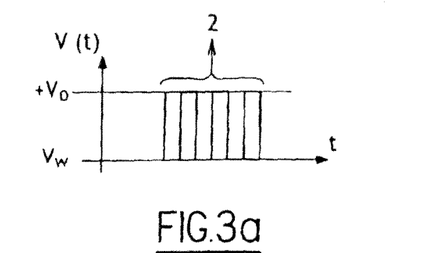
FIGS. 3a and 3b depict, by way of examples, periodic voltage signals supplied and applied to at least one biasable surface, during a sequence referred to as sequence 2 or positive sequence, in which the biasable surface periodically has a positive potential with respect to the referenced potential of the walls $V_w$.
Figure 3B:
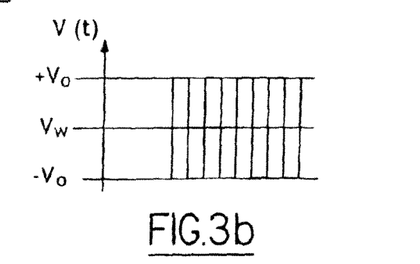

Examples of periodic voltage signals supplied by a means adapted to the biasable surface are illustrated on FIG. 3a and FIG. 3b. On FIG. 3a, the signal supplied by the adapted means is that carried by the biasable surface. On the other hand, on FIG. 3b, the signal supplied by the adapted means is carried to the biasable surface solely when $V > V_w$ (sequence 2), the biasable as therefore "sees" the same signal as at FIG. 3a.

In other words, it is thus possible to clean the biasable surface during sequence 1 by plasma assisted chemical etching and to clean the walls of the reactor in the same way during sequence 2.

Figure 4:
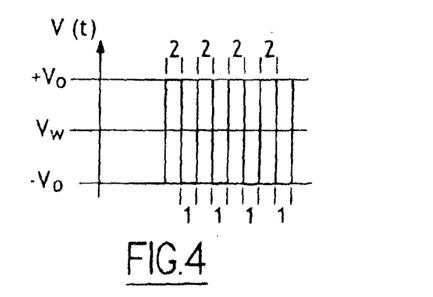
FIG. 4 depicts, by way of example, a period voltage signal supplied and applied to at least one biasable surface, in which the biasable surface periodically has a positive and negative potential respect to the referenced potential of the walls $V_w$.

According to a variant of the invention, a periodic voltage referenced (for example to the potential of the walls, generally earthed) is applied to the biasable surface so that the voltage applied to the biasable surface during the negative half waves (sequences 1) takes a negative value $-V_0$ with respect to the potential of the walls, and so that the voltage applied during the positive half waves (sequences 2) takes a positive value $+V_0$ with respect to the potential of the walls (FIG. 4).

Figure 6:
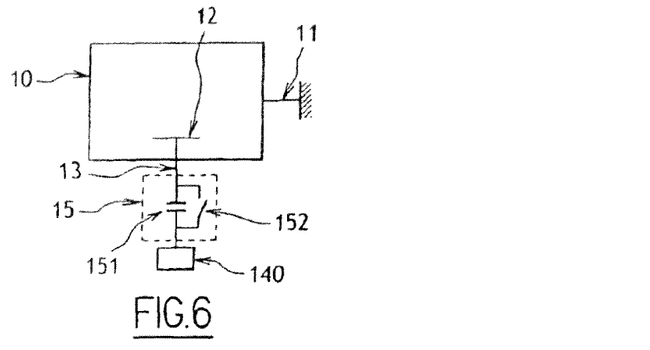

In this variant, it will be understood that there is no longer any negative auto-biasing of the biasable surface (except as long as there remains an insulating deposit). To do this, the low-impedance capacitor is short-circuited (FIG. 6) so that the voltage supplied by adapted means corresponds to the voltage carried to the biasable surface.

Compared with the case of cleaning by successive applications of DC voltages, the auto-biasing values calculated in the case of the application of periodic voltages are more complex than in equations (2) to (6) presented above and depend more or less greatly on the angular velocity $\omega_0 = 2\pi f_0$ (with respect to the ion plasma angular velocity), the shape of the periodic signal or the ratio of the surfaces $S_s$ and $S_w$.

It should be noted however that the angular velocity $\omega_0$ of the cleaning sequences is not a limitative given of the method. In particular, this angular velocity may be smaller or greater than the ion plasma angular velocity $\omega_{pi}$ defined by $\omega_{pi}^2 = n\, e^2/\epsilon_0\, m_1$ where n is the density of the plasma, $-e$ the charge on the electron, $m_i$ the mass of the ions of the plasma and $\epsilon_0$ the permittivity of the vacuum.

It should also be noted that the shape of the periodic signal (the succession of periodic alternating sequences) may be sinusoidal, rectangular or other.

However, the values calculated in equations (2) to (6) are in practice valid in the case of the application of rectangular signals or periodic angular velocity voltages $\omega_0 \ll \omega_{pi}$ and highly asymmetric surfaces $S_s$ and $S_w$.

It should also be noted that the method of cleaning by the application of periodic voltages as described above make sense only if the ratio of the surfaces $S_s$ and $S_w$ is small ($S_s/S_w \ll 1$). This is because, if the surfaces $S_s$ and $S_w$ are close dimensions ($S_s \approx S_w$), a single auto-biasing sequence suffices since the biasing of the two surfaces is then symmetrical with respect to the signal applied, each surface being in turn biased negatively with respect to the plasma potential.

The cleaning by the succession of periodic alternating sequences presented above when the deposit to be cleaned is insulating may also be applied to the cleaning of conductive deposits. However, the cleaning of conductive deposits in two or more sequences under DC voltage procures the advantage of not requiring a periodic voltage generator, much more expensive that a DC supply.

As mentioned above and as far as possible, the voltages applied (whether the deposit be conductive or insulating) must be adjusted so that the ion bombardment energy of the electrode or walls of the reactor remains below or close to the sputtering threshold of the materials that make them up (negligible sputtering of the electrode and walls of the reactor) that is to say typically below 100 eV.

The method according to the invention described above is implemented with means detailed below.

More precisely, the cleaning devices according to the invention comprise, and this in a manner known in the plasma assisted dry chemical cleaning devices, means of producing, in a reactor, a reactive plasma capable of forming volatile reaction products with the deposits to be removed.

These means also comprise a biasable surface (substrate carrier or electrode) of surface area $S_s$ sufficient with respect to the surface area $S_w$ of the walls [equation (1)] to allow modification of the plasma potential. The biasable surface is then said to be of large size.

These means also comprise means of applying to the large-size biasable surface excessive biasing sequences using DC or periodic voltages according to the method of the invention.

Different devices according to the invention can be described. In particular, the plasma production means can consist of different types of plasma such as microwave plasmas for example distributed electron cyclotron resonance (DECR) plasmas, multi-dipole plasmas (non-limitative examples), such as continuous or radio-frequency capacitive discharges, diodes or triodes, where one of the electrodes is used as a biasable substrate carrier, or such as inductive discharges with inductor internal to the chamber. In all these examples, the substrate holders generally comply with the criterion of surface area ratio of equation (1).

With regard to the application of successive sequences of DC voltages (solely for conductive deposits), a controlled supply capable of successively delivering positive and negative continuous voltages, is necessary.

For application of a periodic negative auto-biasing voltage (sequence 1, insulating deposit), a conventional means consists of a generator capable of delivering a periodic voltage through a low-impedance capacitor.

On the other hand, obtaining a positive biasing voltage during the positive half wave (sequence 2, insulating deposit) requires a generator capable of delivering a periodic voltage referenced with respect to a defined potential.

In other words, the invention requires, in very many cases, a generator capable of successively delivering either a periodic voltage through a low-impedance capacitor (biasing of the substrate during the method preceding the cleaning and/or during sequence 1), or a referenced periodic voltage having during the positive half wave (sequence 2) a positive voltage with respect to the potential of the wall.

According to the variant embodiment mentioned above in the context of the method (sequence 1, insulating deposit), a device according to the invention will then have to require a generator capable of delivering a periodic voltage referenced with respect to the wall, that is to say having a periodically negative and then positive voltage, symmetrical for example with respect to the potential of the wall.

Thus a first device comprises means of applying DC voltages that are negative and positive, with reference to the walls of the reactor, to a biasable surface (a substrate carrier for example), and this independently or not of the production of the plasma.

Figure 5:
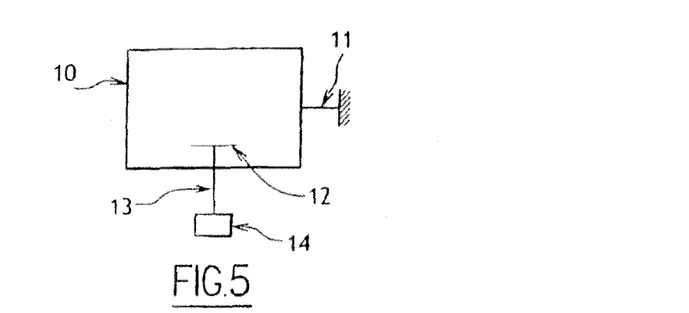
FIGS. 5, 6, 7 and 8 depict schematically different variant embodiments of a device according to the invention.

This first device is illustrated in FIG. 5. It has a reactor 10 referenced to earth 11, a biasable surface 12 electrically connected by a means 13 to a DC voltage generator 14, comprising means of controlling the generator in order to successively deliver positive and negative voltages, with reference to the walls of the reactor.

A second device (FIG. 6) comprises a periodic voltage generator 140, electrically connected to the or each biasable surface 12 by means of a circuit 15 comprising a low-impedance capacitor 151 and means 152 for short-circuiting the capacitor. With this device, the biasing of the biasable surface takes place independently or not of the production of the plasma.

The short-circuiting means 152 may for example, but non-limitatively, be formed by a switch, disposed in parallel to the low-impedance capacitor. In this case, the switch is open during a sequence 1 (FIG. 6 and FIG. 2), so that the voltage generated by the generator passes through the capacitor before arriving at the or each biasable surface. On the other hand, the switch is closed for a sequence 2, so that the voltage generated by the generator is the voltage of the or each biasable surface (FIG. 3a and FIG. 3b).

Figure 7:
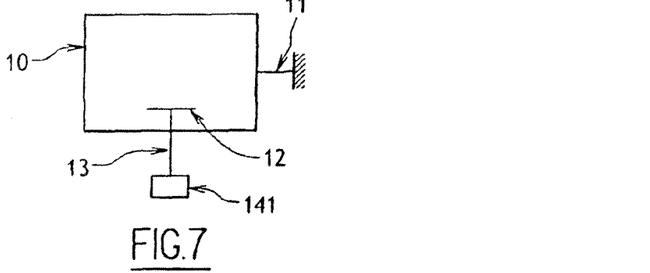

A third device comprises means of applying a periodic voltage, for example by a periodic voltage generator 141, to the or each biasable surface 12, by means of a direct electrical connection 13 (FIG. 7). This voltage is referenced to the potential of the walls of the reactor (generally earthed), and this independently or not of the production of the plasma.

It should be noted that, in the case of capacitive discharges between electrodes, the biasing is not independent of the production of the plasma, whereas it is generally so in inductive plasmas and microwave plasmas.

One of the main advantages of the invention is its simplicity in terms of the method and device compared with current techniques.

This is because the sequence 1 or negative sequence mentioned in the description above uses known plasma-assisted etching methods in so far as the or each biasable surface is negatively biased with respect to the plasma potential (which is slightly greater than the potential of the walls).

The sequence 2 or positive sequence, for its part, therefore modifies the nominal functioning of the reactor in order to achieve an objective of cleaning the walls of the reactor, which are for this purpose put to a referenced potential.

For certain types of applications known to persons skilled in the art, use is made, in addition to a cathode (which constitutes a biasable surface) negatively biased with respect to the plasma potential, at least one anode intended to collect the electrons, which is, in nominal functioning, biased positively with respect to the plasma potential.

However, in this type of application and in order to avoid insulating deposits on this anode or these anodes, means are provided for negatively biasing the anode or anodes with respect to the plasma potential (the walls are not referenced in this type of application). This method, which can be likened to a sequence 1 as described above from the point of view of the anode or anodes, is implemented for the purpose of ensuring continuity of nominal functioning of the reactor, by ensuring that the anode fulfills its role of electron collector. This is the case for example with the document EP 1 458 006.

Among the advantages that the invention procures, it can in particular be mentioned that it:

1) implements conventional etching methods, tried and tested and well mastered;
2) does not require any modification to the reactor architecture;
3) requires only minor modifications to the biasing supplies for the biasable surface (substrate carrier or electrode);
4) does not cause any sputtering of the biasable surface if the biasing thereof is independent of the production of the plasma (for example plasmas produced by microwaves), and is maintained at a value less than that corresponding to the sputtering of the surfaces of the reactor;
5) offers a method that is scarcely damaging for the reactor or the environment.

To give a clear idea, the applicant supplies below an example of a typical application of its invention, given by way of non-limitative example.

Figure 8:
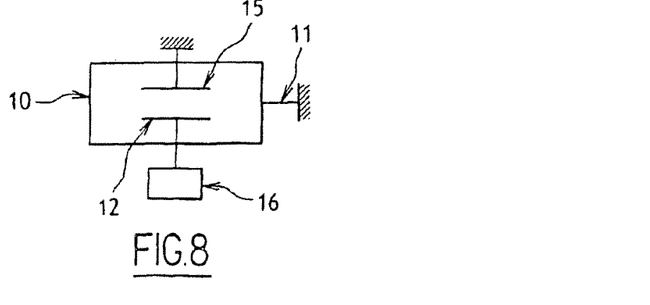

A capacitive discharge is considered in a reactor 10 connected to earth 11 created between a biasable surface 12 (a substrate carrier) to which a voltage is applied and an earthed electrode 15 (FIG. 8) or also a reactor of the same dimensions in which the plasma is produced by microwaves and where the same substrate carrier can be biased by a voltage. The element 16 corresponds, according to the type of voltage generated, to the generator 14 in FIG. 5, to the assembly formed by the generator 140 and the circuit 15 in FIG. 6, or to the generator 141 in FIG. 7.

The ratio of the earthed surfaces and those biasable continuously or periodically (RF) is 700 cm$^2$/7000 cm$^2$, that is to say 1/10, which perfectly corresponds to the criterion defined by equation (1) and to the case of a substrate-carrier surface that is small compared with the surface of the walls.

A well known example is the removal of the deposits of SiO$_2$ on the walls of a deposition reactor. In the context of the invention, this deposit can be removed by means of an SF$_6$ plasma by the formation of the reaction products SiF$_4$ and O$_2$ by chemical etching assisted by ion bombardment. It should be noted that the use of CF$_4$, and more generally fluorocarbon gases, may, according to the plasma parameters, lead to a CF$_x$ deposit of the Teflon type.

The invention claimed is:
1. Method of cleaning, by plasma-ion bombardment assisted dry chemical etching method, a reactor (10) having an undesirable deposit on its reactor walls and on at least one other biasable electrode surface (12), wherein during a step of producing plasma, there are submitted a plurality of alternating successions of:
a negative sequence (1) of cleaning the at least one biasable electrode surface by negative biasing of each electrode surface during the step of producing plasma, with respect to the potential said reactor walls; and
a positive sequence (2) of cleaning the walls of the reactor by positive biasing of at least one electrode surface during the step of producing plasma, with respect to the walls of the reactor, the walls being at a referenced potential, and wherein a periodic voltage referenced to a defined DC potential is directly applied to the at least one biasable electrode surface.
2. Method according to claim 1, wherein a plurality of periodic alternating successions of a negative sequence (1) and a positive sequence are implemented.

3. Method according to claim 1, wherein:
- a DC negative biasing of the at least one electrode surface with respect to the potential of the reactor walls is performed during the negative sequence (1), and
- a DC positive biasing of the biasable surface of at least one electrode with respect to the potential of the reactor walls is performed during the positive sequence (2).

4. Method according to claim 1, wherein the periodic voltage is referenced to the potential of the reactor walls.

5. Method according to claim 1, wherein the reactor walls are at the earth potential.

6. Method according to claim 1, wherein the periodic voltage is symmetrical with respect to the DC referenced potential.

\* \* \* \* \*

UNITED STATES PATENT AND TRADEMARK OFFICE
CERTIFICATE OF CORRECTION

PATENT NO. : 9,812,298 B2  
APPLICATION NO. : 14/313200  
DATED : November 7, 2017  
INVENTOR(S) : Jacques Henri Pelletier et al.

Page 1 of 1

It is certified that error appears in the above-identified patent and that said Letters Patent is hereby corrected as shown below:

On the Title Page

Item (30) is missing. Please insert as follows:  
--(30) Foreign Application Priority Data  
Jun. 13, 2006 (FR) ............................0605238--

Signed and Sealed this  
Eighteenth Day of September, 2018

Andrei Iancu  
*Director of the United States Patent and Trademark Office*